United States Patent [19]

Cunningham, Jr.

[11] Patent Number: 4,673,931

[45] Date of Patent: Jun. 16, 1987

[54] WAVEFORM DATA DISPLAY

[75] Inventor: Howard G. Cunningham, Jr., Beaverton, Oreg.

[73] Assignee: Tektronix, Inc., Beaverton, Oreg.

[21] Appl. No.: 713,137

[22] Filed: Mar. 18, 1985

[51] Int. Cl.⁴ ............................................. G09G 1/16
[52] U.S. Cl. .................................. 340/722; 340/715; 324/121 R
[58] Field of Search ............... 340/715, 721, 722, 720, 340/744, 747; 324/121 R, 83 D

[56] References Cited

U.S. PATENT DOCUMENTS

| | | | |
|---|---|---|---|
| 4,364,036 | 12/1982 | Shimizu | 340/715 |
| 4,455,558 | 6/1984 | Williams, Jr. et al. | 340/722 X |
| 4,516,119 | 5/1985 | Fukuta | 340/722 |
| 4,525,667 | 6/1985 | Sawano et al. | 340/715 X |
| 4,536,760 | 8/1985 | Navarro | 340/722 |
| 4,554,536 | 11/1985 | Jackson | 340/747 |
| 4,560,981 | 12/1985 | Jackson et al. | 340/747 |

*Primary Examiner*—Gerald L. Brigance
*Attorney, Agent, or Firm*—John P. Dellett; Robert S. Hulse

[57] ABSTRACT

Acquired sampled waveform data is displayed on a screen as a busform, wherein a change of state in the waveform during a sampling interval is represented by a solid block character on the screen, and wherein the lack of a change of state in any of the channels during a sampling interval is represented by a space character of the same width as the block character. The blocks and spaces representing contiguous sampling intervals are of the same width and are displayed in horizontal sequence across the screen such that the time between state changes is graphically represented by the horizontal distance between the blocks. Numbers indicating the associated waveform state are displayed when possible in the space or spaces following each block character.

13 Claims, 12 Drawing Figures

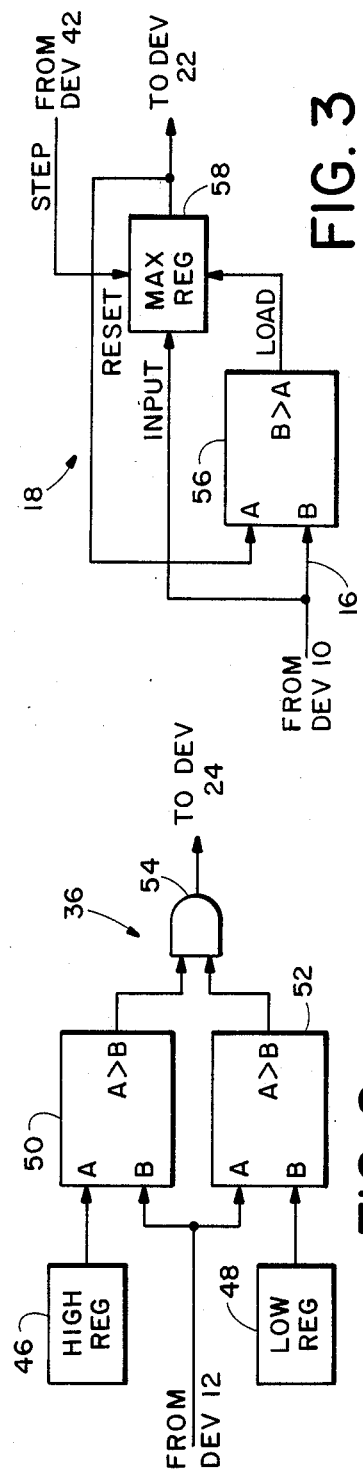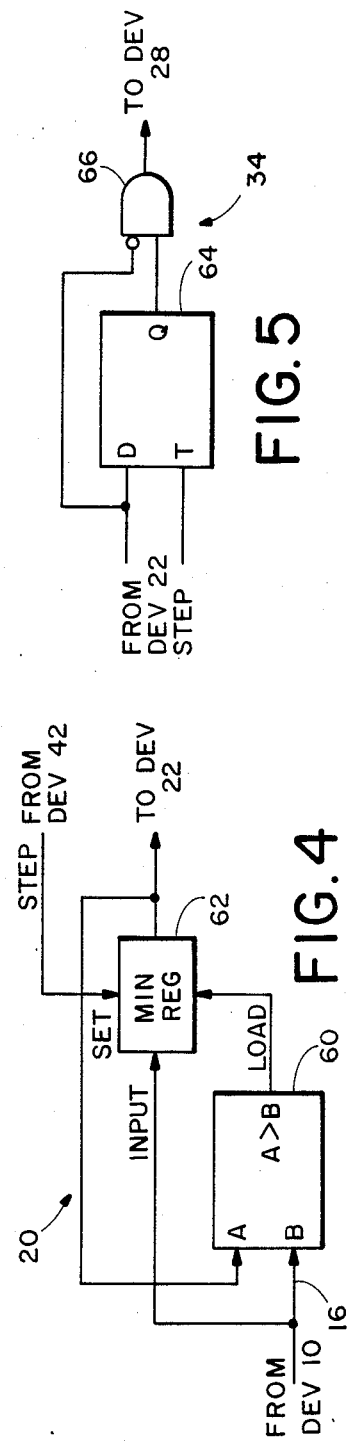

WAVEFORM DATA DISPLAY

BACKGROUND OF THE INVENTION

The present invention relates to devices for acquiring and storing digital data representing waveforms and in particular to a method and apparatus for compactly displaying such acquired and stored data.

Many devices, such as logic analyzers, sample waveforms at regular intervals and generate digital data representing the state or the magnitude of the waveform at the moment of sampling. The data is typically stored in a random access memory (RAM) to be used subsequently in generating representations of the sampled waveforms on a cathode ray tube screen. In the past few years, the cost of random access memory has decreased such that it has become economical to use relatively large acquisition memories in logic analyzers, permitting the storage of large amounts of data representing long or frequently sampled waveforms.

Logic analyzers have typically reproduced the sampled waveforms on a screen in graphical form. As the detail and the length of the waveforms stored in memory have increased, simple reproduction of an entire stored waveform is not possible, even with the use of large, high resolution screens. Use of state displays has allowed acquired waveform information to be more compactly displayed. In a state display, the state of a waveform or a set of waveforms is represented by a number displayed at each sampling interval. While this allows waveform data to be compactly displayed, it is not in a form which is easily assimilated by most logic analyzer users, since most users think of waveforms in a graphical, rather than a numeric form, and the numeric state display is not well adapted for depicting the temporal relationships between two waveforms in an easily recognizable manner.

SUMMARY OF THE INVENTION

According to one aspect of the invention, waveform data acquired by a logic analyzer from one or more digital channels is displayed on a screen as a busform, wherein a change of state in any of the channels during a sampling interval is represented by a solid block character on the screen, and wherein the lack of a change of state in any of the channels during a sampling interval is represented by a space character of the same width as the block character. The blocks and spaces representing contiguous sampling intervals are displayed in horizontal sequence across the screen such that the time between state changes is graphically represented by the horizontal distance between the blocks. Since waveform data is often represented in manufacturer's literature in a similar form, many operators are familiar with, and have an intuitive understanding of, this method of waveform representation. Moreover, the display of waveform data as a busform permits the operator to correlate easily the acquired data with manufacturer's specifications.

According to another aspect of the invention, means are provided to compress the display by displaying a block on the screen whenever one or more changes of state occur during a selected number of sampling periods and by displaying a space whenever no changes of state occurs during the same number of sampling periods. This allows the operator to view a longer portion of the busform on the screen.

According to still another aspect of the invention, means are provided to expand the busform display to permit an operator to display a smaller portion of a busform on the screen in greater detail.

According to a further aspect of the invention, data representing the associated waveform state is displayed when possible in the space or spaces following each block character.

It is accordingly an object of the invention to provide a new and improved method and apparatus for displaying acquired waveform data on a screen in a compact, easily understood graphical form, preserving state transition history and the temporal relationships of those transitions.

It is another object of the invention to provide a new and improved method and apparatus for displaying acquired waveform data on a screen in a form which is easily correlated with published manufacturer's waveform data.

It is still another object of the invention to provide a new and improved method and apparatus for displaying acquired waveform data on a screen in a graphical form which can be expanded to emphasize state transition detail or compressed to increase the duration of the waveform displayed.

It is yet another object of the invention to provide a new and improved method and apparatus for displaying acquired waveform data on a screen wherein the waveform states are alphanumerically represented.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1. is a block diagram of an apparatus for generating a busform display according to the present invention, FIG. 2 is a block diagram depicting an embodiment of the boundary detector of FIG. 1 in more detail, FIG. 3 is a block diagram depicting an embodiment of the maximum detector circuit of FIG. 1 in greater detail, FIG. 4 is a block diagram depicting an embodiment of the minimum detector circuit of FIG. 1 in greater detail, FIG. 5 is a block diagram depicting an embodiment of the multiplexer control circuit of FIG. 1 in more detail, FIG. 6A is a drawing of a space display character representing the lack of a change of state in an acquired waveform during a display period, FIG. 6B is a drawing of a block display character representing the occurrence of one or more acquired waveform data state changes during a display period, FIG. 6C is a drawing of a space display character including a state number.

DETAILED DESCRIPTION

Figure 1:
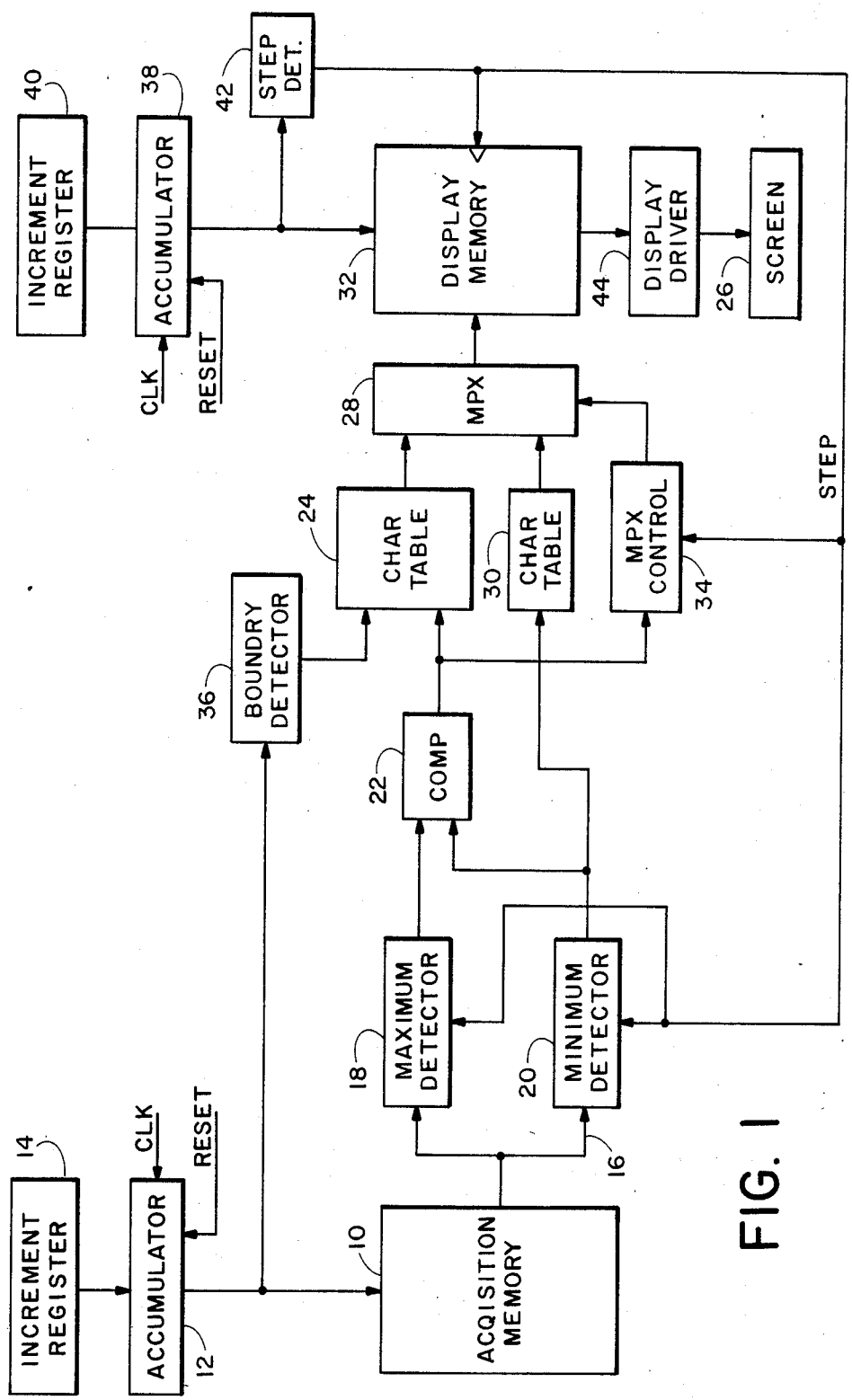

Referring to FIG. 1, a waveform display circuit illustrated in block diagram form is adapted to generate a busform display of acquired waveform data associated with one or more sampled waveforms in accordance with a preferred embodiment of the present invention.

Figure 7A:
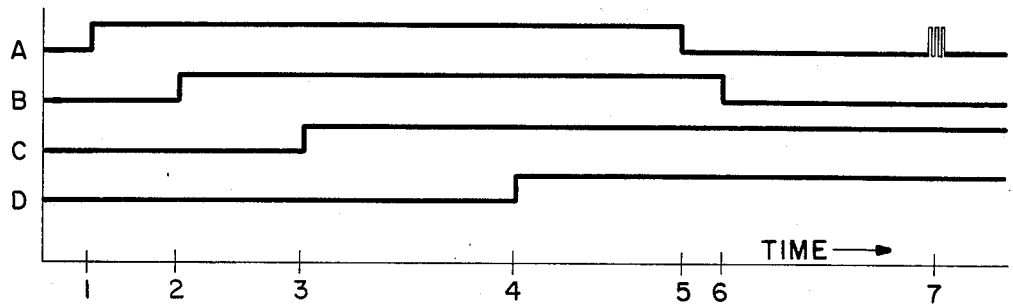
FIG. 7A is a graphical representation of four typical digital waveforms.

Four such waveforms, designated A, B, C and D, are depicted in graphical form in FIG. 7A. Referring again to FIG. 1, the waveforms are sampled by a logic analyzer (not shown) at regular time intervals. A binary state number representing the collective state of the four waveforms is stored in a random access acquisition memory 10, with state numbers for successive sampling intervals being stored at successive acquisition memory 10 addresses. In the example of FIG. 7A, the state number to be stored is a 4-bit binary number wherein the state (0 or 1) of waveform A is the least significant bit, the state of waveform D is the most significant bit, and the states of waveforms B and C are the next least significant bits, respectively. Therefore, the state number may take on any value from 0000 to 1111 (0 to F in hexadecimal form). For example, in FIG. 7A, prior to time 1 the state number is 0000, while between time 1 and time 2, the state number stored is 0001. Similarly, between times 2 and 3 the state number is 0011, and after time 7 the state number is 1100. The logic analyzer apparatus required for sampling the waveforms, and calculating and storing the state numbers, is well known in the art and is not further detailed herein.

Figure 6A:
Figure 6B:
Figure 7B:
FIG. 7B is a busform representation of the collective state of the four waveforms of FIG. 7A.

According to the present invention, the stored state number data is displayed on cathode ray tube (CRT) screen 26, of FIG. 1 in a busform graphical representation wherein a change of state number during a given time interval (display period) is represented by a block character, such as that shown in FIG. 6B, while the lack of a change of state number during a display period is represented by a space character, such as depicted in FIG. 6A. FIG. 7B is a typical diagram of a busform display of the waveforms of FIG. 7A, according to the present invention. State changes occurring at times 1 to 6 in FIG. 7A are represented by corresponding block characters 1 to 6 of FIG. 7B while the lack of state change in the time intervals between state changes is represented by corresponding space characters between the blocks. As can be seen in FIG. 7A, waveform A changed state several times in rapid succession during one display period immediately prior to time 7. The block at position 7 indicates that at least one state change has occurred during the previous display period, but since the display period is larger than the period used to sample the waveforms, in the example shown, block characters indicating each of the state changes occurring during the period of rapid state changes in waveform A immediately prior to time 7 are not separately displayed in the busform of FIG. 7B. As described in more detail hereinbelow, the display period may be shortened to allow for separate display of block characters associated with each state change in the period immediately preceding time 7. Further, as also described hereinbelow, the display period may be increased (thereby decreasing the display resolution) such that the waveform data is further compressed, thereby allowing longer portions of waveforms to be characterized by a busform on a screen.

Figure 6C:

In addition to depicting state changes using the block characters, the hexidecimal equivalent of the state numbers associated with the waveforms, during the periods between state changes, are displayed superimposed over the corresponding space characters following each block, whenever there are sufficient such space characters to do so. An example of such superposition is shown in FIG. 6C. Thus, for example, at position 3 of FIG. 7B, the block character represents the state change at time 3 of FIG. 7A, while the number 7 following the third block character represents the state number 1100 (binary) of the lines between times 3 and 4. No state number is displayed following the block at position 5 of FIG. 7B because there is insufficient space between blocks at positions 5 and 6 to do so. The number C following the block character at position 7 indicates the state of the waveforms after the last change of state immediately preceding time 7. While the preferred embodiment of the present invention provides for display of only single hexidecimal character state numbers as shown in FIG. 7B, state numbers or other data descriptive of the state of the sampled waveforms consisting of more than one digit and in other than hexidecimal form may be displayed in alternative embodiments.

Referring again to FIG. 1, acquisition memory 10 is sequentially addressed by an accumulator 12. Accumulator 12 adds the contents of an increment register 14 to a stored number each time accumulator 12 detects a pulse (CLK) from a system clock (not shown). Initially, the number stored by accumulator 12 is set to zero by an externally generated RESET signal. Assuming, by way of example, that acquisition memory 10 is a 64K (65,536) byte memory, capable of storing a 4 bit state number at each memory location, and that accumulator 12 is capable of storing a 24 bit number, with the upper 16 bits being used to address acquisition memory 10, if increment register 14 contains a binary 1 the contents of accumulator 12 will increase by 1 each time the accumulator is strobed by a CLK pulse. Every 256 times the accumulator 12 increments by 1, the current address of acquisition memory 10 increments by 1 and the binary state number stored at the current address occurs on four data output lines 16 of acquisition memory 10. Similarly, if the binary increment register 14 contains the binary number 256, then the number stored by accumulator 12 increases by 256 and the current address of acquisition memory 10 is incremented by one on occurrence of each CLK pulse.

Data output lines 16 from acquisition memory 10 are applied in parallel to a maximum detector 18 and a minimum detector 20. Maximum detector 18 compares the value of the current state number on lines 16 with the value of an internally stored number and replaces the stored number with the currently addressed state number if it is larger than the stored number. In contrast, minimum detector 20 compares the value of the current state number on lines 16 with the value of a stored number and replaces the stored number with the current state number if it is smaller than the stored number. The stored number in the maximum detector 18 is reset to 0000 on each occurrence of a pulse on applied STEP control line indicating the start of a new display period. In a similar fashion the number stored by the minimum detector is reset to 1111 on receipt of a STEP pulse. Thus maximum detector 18 stores the largest state number outputted by acquisition memory 10 during a display period between STEP pulses, while minimum detector 20 stores the smallest state number outputted by acquisition memory 10 during a display period.

The numbers stored by maximum detector 18 and minimum detector 20 are transmitted to the A and B inputs of comparator 22. Comparator 22 produces a high logic level output signal whenever the A and B inputs are dissimilar and a low logic level signal whenever the A and B inputs are similar. The output of comparator 22 is applied to a character table 24 which generates binary numbers representing the graphical characters block and space forming the busform to be displayed on screen 26. If the output of comparator 22 is low, then character table 24 will output a number representing the graphical space character depicted in FIG. 6A, while if the output of comparator 22 is high, character table 24 will output a number representing the graphical block character depicted in FIG. 6B.

Character table 24 may be a read only memory with the data from comparator 22 being applied to the address inputs of the memory and the graphical character numbers being generated at the data output terminals of the memory. Each memory location of character table 24 addressed by comparator 22 may be preloaded with whatever data may be required by display driver 44 to produce the appropriate graphical character on screen 26.

The output of character table 24 is applied to one input channel of a multiplexer 28. At the same time, the binary state number stored by minimum detector 20 is converted by a second character table 30 (which may be similar to character table 24) to a corresponding character code to be used in displaying the state number superimposed on a space character on screen 26, as illustrated in FIG. 6C. The converted state number is then applied to a second input channel of multiplexer 28. The output of multiplexer 28, equivalent to the data input from either character table 24 or 30 depending on the switching state of multiplexer 28, is connected to the data input terminals of a random access display memory 32 such that the transmitted data is stored at the currently addressed display memory location whenever the write control of display memory 32 is strobed by a STEP pulse.

A multiplexer control circuit 34 monitors the output of comparator 22 and determines if there is a display period between two STEP pulses wherein there is no change of state immediately following a display period wherein there has been a change of state. If there is such a period of quiescence following a display period of state change, then control circuit 34 causes multiplexer 28 to pass the data from circuit 30 to display memory 32 during the quiescent period. At all other times control circuit 34 causes multiplexer 28 to pass the data from character table 24 to the data inputs of display memory 32.

Boundary detector 36 monitors the current address of acquisition memory 10 and produces a high logic level output signal whenever the current address falls within stored limits. This output signal is also applied to an address line of character table 24, along with the output signal of comparator 22. If the output signal of boundary detector 36 is not in a high state, then the data output of character table 24 represents a blank space to be ignored by display driver 44 in creating the busform display on screen 26. If the output signal of boundary detector 36 is in a low logic level state, then the output of character table 24 will be determined by the state of the output of comparator 22 as described hereinabove.

Thus the limit data stored in boundary detector 36 controls the beginning and ending point of the busform display on screen 26.

Display memory 32 is sequentially addressed by an accumulator 38 which adds the contents of an increment register 40 to a stored number each time accumulator 38 detects a pulse (CLK) from the system clock. Initially, the number stored by accumulator 12 is set to zero by an externally generated RESET signal. Assuming, by way of example, that display memory 10 is a 64K byte random access memory capable of storing one character data number at each memory location, accumulator 12 may be capable of storing a 24 bit binary number, with the upper 16 bits being used to address display memory 32. If increment register 40 contains a binary 1, the contents of accumulator 38 will increase by 1 each time the accumulator is strobed by a CLK pulse and the current address of display memory 32 will increase by 1 for every 256 CLK pulses. Each time display memory 32 receives a STEP pulse at its write strobe input terminal, the data from multiplexer 28 is written into the current memory location.

Step detector 42 monitors the least significant bit of the address lines leading to display memory 32 from accumulator 38 and generates a STEP pulse each time the least significant bit changes state. Thus the STEP pulses define the beginning and end of each display period, and any block or space character displayed in the busform on screen 26 represents the state change behavior of all of the sampled waveforms during a single display period. As indicated previously, the STEP pulse is applied to the write strobe input of display memory 32 to initiate a write operation, and to minimum detector 20, maximum detector 18 and multiplexer control circuit 34 to indicate the beginning of a new display period.

The contents of display memory 32 are accessed by a suitably configured display driver circuit 44 and used as a basis to generate a busform display on screen 26. Circuits capable of performing the function of display driver circuit 44 are well known in the art and are not further detailed herein.

A more detailed embodiment of boundary detector 36 of FIG. 1, shown in block diagram form in FIG. 2, comprises a high address register 46, a low address register 48, comparators 50 and 52, and an AND gate 54. Initially, high register 46 is loaded with the 16 bit address of the last waveform sample data in acquisition memory 10 to be displayed on the screen, while low address register 48 is loaded with the address of the first waveform sample data to be represented on the screen. The data stored in register 46 is transmitted to the A input terminal of comparator 50 while the data stored by register 48 is applied to the B input of comparator 52. The address data from accumulator 12 is applied to the B input of comparator 50 and to the A input of comparator 52. Comparators 50 and 52 each produce a high logic level output when the value of the A input exceeds the value of the B input. The outputs of comparators 50 and 52 are connected to AND gate 54 such that the output of AND gate 54 is high only when the current address of acquisition memory 10 falls between the values stored in registers 46 and 48. This AND gate 54 output is then applied to character table 24 of FIG. 1.

A more detailed embodiment of maximum detector 18 of FIG. 1, depicted in block diagram form in FIG. 3, comprises a comparator 56 and a maximum register 58. The state number contained at the current acquisition memory 10 address is applied to a B input of comparator 56 and to the data input terminals of register 58, while the number stored by maximum register 58 is applied to an A input of comparator 56. The output of comparator 56, connected to a load control input of register 58, is high if the B input exceeds the A input. When the load control input of register 58 is driven high, the contents of register 58 are replaced by the current state number. This happens whenever the current state number is higher than any previously stored state number. Register 58 is reset to zero upon receipt of a STEP pulse. Thus the number stored by register 58 at the time of reset is equal to the highest state number appearing at the data output terminal of acquisition memory 10 during the previous display period.

A more detailed embodiment of minimum detector 20 of FIG. 1, depicted in block diagram form in FIG. 4, comprises a comparator 60 and a minimum register 62. The state number contained at the current acquisition memory 10 address is applied to a B input of comparator 60, and to the data input terminal of register 62, while the number stored by minimum register 62 is applied to an A input of comparator 60. The output of comparator 60, connected to a load control input of register 62, is high if the A input exceeds the B input. Register 62 is reset to a maximum upon receipt of a STEP pulse. Thereafter the contents of register 62 are replaced by the current state number whenever the current state number is lower than any previously stored number. The number stored by register 62 just prior to reset is equal to the lowest state number appearing at the data output terminal of acquisition memory 10 during the previous display period.

The multiplexer control circuit 34 of FIG. 1 is shown in more detail in FIG. 5 in block diagram form. In this embodiment, multiplexer circuit 34 comprises a D type flip-flop 64 which stores the current state of the output of comparator 22 each time it receives a STEP pulse. The output state of terminal Q of flip-flop 64 controls the state of a non-inverting input to an AND gate 66 while the output of comparator 22 controls the state of an inverting input to AND gate 66. The output of AND gate 66 controls the switching state of multiplexer 28. When a change of state of a sampled waveform set occurs during a current display cycle, the output of circuit 22 goes high, driving the output of AND gate 66 low regardless of the state of flip-flop 64. When no change of state of a sampled waveform is detected between successive STEP pulses, the output of circuit 22 remains low. If no change of state of the sampled waveform occurs during the previous display period, the Q output of flip-flop 66 will be low, causing the output of AND gate 66 to remain low regardless of the state of the output of circuit 22. Only if flip-flop 64 is set, the high Q output indicating a change of state of sampled waveform occurred during the previous display period, and if the output of circuit 22 is low, indicating no change of sampled waveform state during the current display period, will the output of AND gate 66 be high, thereby causing multiplexer 28 to couple the output of character table 30 to display memory 32. Thus, the multiplexer control circuit causes display memory 32 to store the state number only during the first display period after a sampled waveform state change, and only if no subsequent state change occurs during that display cycle.

Referring to FIGS. 1 and 6, to prepare the circuit for operation, acquisition memory 10 is loaded with the appropriate waveform data while the high and low registers of boundary detector 36 are loaded with the acquisition memory addresses of the first and last data points to be displayed in the busform on screen 26. Increment register 14 is loaded with a number from 1 to 255 to control the number of CLK pulses required to increment the current address of acquisition memory 10. Similarly, increment register 40 is loaded with another number from 1 to 255 to control the number of CLK pulses required to increment the current address of display memory 32.

The relative sizes of the numbers loaded into increment registers 14 and 40 control the amount of expansion or compression of the busform display on screen 26. If increment register 14 contains a small number, then the address of acquisition memory 10 is incremented less often with respect to the frequency of the system CLK pulses and less often with respect to the frequency of the STEP pulses which control the rate of data storage in display memory 32. Thus, with a relatively small number in increment register 14, relatively fewer waveform sample points in acquisition memory 10 are applied to maximum detector 18 and minimum detector 20 between any two STEP pulses. Therefore the data stored in display memory 32 on occurrence of each STEP represents the change of state behavior of the sampled waveforms over relatively fewer sample points. It follows that by decreasing the size of the number stored in increment register 14, the busform display is expanded, showing more state change detail.

On the other hand, the smaller the number stored in increment register 40, the more compressed is the busform display, with the state change behavior of more successive sample points in acquisition memory 10 being lumped into a single representative busform character on screen 26. With a relatively small number in register 40, accumulator 38 requires more CLK pulses to increment display memory 32 and step detector 42 produces STEP pulses less often. The less frequent STEP pulses cause maximum and minimum detectors 18 and 20 to reset less often such that more successive waveform sample points are received and evaluated by maximum and minimum detectors 18 and 20 between each resetting.

Initially an operator may want to set the high and low address numbers in boundary detector 36 widely spaced so that a long portion of a sampled wave form will be characterized by the busform on screen 26. At the same time, the operator would set the number in increment register 14 relatively high and the number in increment register 40 relatively low, such that the busform will be highly compressed. Because the resulting busform would be compressed, comparatively little detail of the waveform activity would be apparent. Fewer state numbers may be displayed due to the lack of sufficient display space following state change indicators, but periods of high state change activity could be distinguished from periods of low state change activity and gross changes in state change patterns could be distinguished. The operator could then check sections of the busform in increasing detail by setting narrower limits in boundary detector 36, lower numbers in increment register 14 and higher numbers in increment register 40. At the highest level of detail, every state change during a small portion of the sampled waveforms will be separately represented by a state change character in the busform display, and there will be sufficient space following every state change character to display the state number.

Figure 8A:
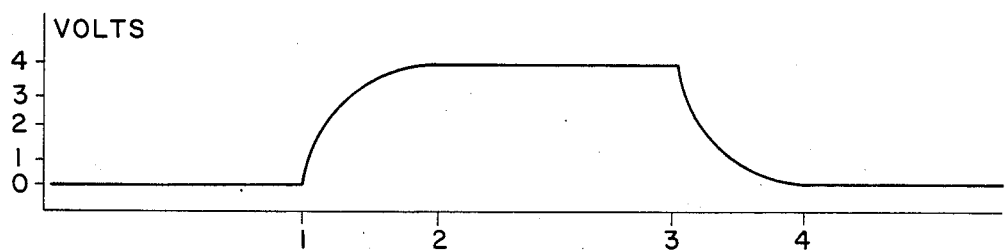
FIG. 8A is a graphical representation of a typical analog waveform.
Figure 8B:
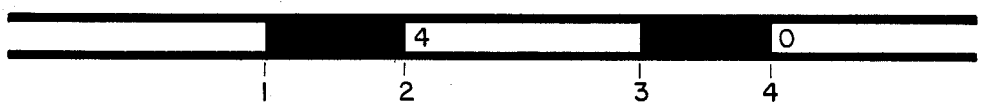
FIG. 8B is a busform representation of the analog waveform of FIG. 8A.

While in the the preferred embodiment the data stored in acquisition memory 10 has been sample data associated with digital waveforms as depicted in FIG. 7A, such sample data may also represent a sampled analog waveform as seen in FIG. 8A, where the data stored in acquisition memory 10 represents the voltage magnitude of the analog waveform at each sampled point. A busform, such as might be produced by the circuit of FIG. 1 from such stored sample data is shown in FIG. 8B. Periods of change in waveform magnitude would appear in the busform as a solid string of state change characters followed by a state number representing the voltage of the waveform at the end of the change. No modification to the circuit of FIG. 1 is necessary to produce such a busform from such analog waveform sample data.

While a preferred and an alternative embodiment of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A method for representing a waveform on a screen comprising the steps of:
   a. determining the state of the waveform at regular sampling intervals,
   b. determining if the waveform has changed state during a waveform display period comprising a plurality of sampling intervals,
   c. displaying a first indicating character on the screen if the waveform has changed state during the display period,
   d. displaying a second indicating character on the screen if the waveform has not changed state during the display period, the first and second characters being recognizably different, and
   e. repeating steps b, c and d for subsequent waveform display periods such that indicating characters corresponding to successive display periods are successively displayed on the screen.

2. A method as in claim 1 wherein said first and second indicating characters are of the same width.

3. A method as in claim 1 wherein the first indicating character comprises a solid block and wherein the second indicating character comprises a pair of horizontal lines.

4. A method as in claim 1 wherein said second indicating character comprises a representation of the state of the waveform during the display period.

5. A method for representing a waveform set on a screen comprising the steps of:
   a. sampling the state of the waveform set at regular sampling intervals,
   b. storing data representing the state of the waveform set at each sampling interval in a random access acquisition memory, data for successive sampling intervals being stored at successive memory addresses,
   c. determining if the data stored at each location within a group of successive acquisition memory locations has the same value as data stored at every other location within said group,
   d. displaying a first indicating character on the screen if the data is not of the same value at each said successive memory address within said group, and
   e. displaying a second indicating character on the screen if the data is of the same value at each said successive memory address within said group, the first and second indicating characters being recognizably different.

6. A method as in claim 5 further comprising the step:
   f. repeating steps c, d and e for successive groups of acquisition memory addresses such that indicating characters corresponding to successive address groups are successively displayed on the screen.

7. A method as in claim 5 wherein said second indicating character comprises a representation of the state of the waveform set.

8. An apparatus for representing a waveform set on a screen comprising:
   means to sample the state of the waveform set at regular sampling intervals,
   means to store data representing the state of the waveform set at each sampling interval in a random access acquisition memory, data for successive sampling intervals being stored at successive memory addresses, and
   means to determine if the data stored at each location within a group of successive acquisition memory locations has the same value as data stored at every other location within said group, to display a first indicating character on the screen if the data is not of the same value at each said successive memory address within said group, and to display a second indicating character on the screen if the data is of the same value at each said successive memory address within said group, the first and second indicating characters being recognizably different.

9. An apparatus as in claim 8 further comprising means to selectively increase or decrease the number of successive acquisition memory locations contained within said groups such that the number of sampling intervals associated with each indicating character may be increased or decreased.

10. An apparatus as in claim 8 wherein said second indicating character comprises a representation of the state of the waveform set during the display period.

11. An apparatus as in claim 8 wherein said means to determine comprises:
    a source of clock pulses,
    a source of display step pulses, one such display step pulse occurring after each occurrence of a selected number of clock pulses,
    an increment register for storing an increment number,
    an accumulator, for storing an address number, the address number being incremented by the increment number on each clock pulse occurrence, a portion of the address number being applied to address the random access acquisition memory such that the acquisition memory places currently addressed data on a data output bus, and
    means to determine if all data occurring on the data output bus between any two display step pulses has the same value.

12. An apparatus as in claim 8 wherein said means to display first and second indicating characters comprises:
    means to generate character data representing the first indicating character each time said means to determine determines the data is not of the same value at each said successive memory address within said group and for generating character data representing the second indicating character each time said means to determine determines the data is of the same value at each said successive memory address within said group, a random access display memory for storing said character data generated by said character table, and means to display the contents of the display memory in the form of said indicating characters on the screen.

13. An apparatus as in claim 12 wherein said second indicating character represents the magnitude of the waveform.

* * * * *